(12) United States Patent
Larson et al.

(10) Patent No.: US 7,939,778 B2
(45) Date of Patent: May 10, 2011

(54) PLASMA PROCESSING CHAMBER WITH GUARD RING FOR UPPER ELECTRODE ASSEMBLY

(75) Inventors: Dean J. Larson, Pleasanton, CA (US); Daniel Brown, Brentwood, CA (US); Saurabh J. Ullal, Union City, CA (US)

(73) Assignee: Lam Research Corporation, Fremont, CA (US)

( * ) Notice: Subject to any disclaimer, the term of this patent is extended or adjusted under 35 U.S.C. 154(b) by 178 days.

(21) Appl. No.: 12/357,989

(22) Filed: Jan. 22, 2009

(65) Prior Publication Data
US 2009/0127234 A1 May 21, 2009

Related U.S. Application Data

(63) Continuation of application No. 11/701,430, filed on Feb. 2, 2007, now Pat. No. 7,482,550.

(60) Provisional application No. 60/852,345, filed on Oct. 16, 2006.

(51) Int. Cl.
*B23K 10/00* (2006.01)

(52) U.S. Cl. ......... 219/121.43; 219/121.41; 156/345.34; 156/345.47; 118/723 I (58) Field of Classification Search ............. 219/121.43, 219/121.4, 121.41, 121.44; 156/345.34; 156/345.47; 118/723 I
See application file for complete search history.

(56) References Cited

U.S. PATENT DOCUMENTS

| | | |
|---|---|---|
| 5,534,751 A | 7/1996 | Lenz et al. |
| 5,997,962 A | 12/1999 | Ogasawara et al. |
| 6,073,577 A | 6/2000 | Lilleland et al. |
| 6,824,627 B2 | 11/2004 | Dhindsa et al. |
| 6,890,861 B1 | 5/2005 | Bosch |
| 2002/0150519 A1 | 10/2002 | Barnes et al. |
| 2005/0133164 A1 | 6/2005 | Fischer et al. |
| 2006/0207502 A1 | 9/2006 | Dhindsa et al. |
| 2007/0234705 A1 | 10/2007 | Emsellem |

FOREIGN PATENT DOCUMENTS

| | | |
|---|---|---|
| JP | 17-19508 A | 1/2005 |
| JP | 2005-19508 A | 1/2005 |

OTHER PUBLICATIONS

International Search Report and Written Opinion dated Jan. 14, 2008 for PCT/US2007/022080.
Chinese Official Action dated May 12, 2010 for Chinese Appln. No. 200780038473.9.
SG Written Opinion and Search Report dated Mar. 18, 2010 for Singapore Appln. No. 200902518-0.

*Primary Examiner* — Mark H Paschall
(74) *Attorney, Agent, or Firm* — Buchanan Ingersoll & Rooney PC (57) ABSTRACT

A plasma processing chamber, which includes an upper electrode assembly, a lower electrode assembly, and a plasma confinement assembly. The upper electrode assembly includes an upper electrode, a backing member, the backing member attachable to an upper surface of the upper electrode, and a guard ring surrounding an outer surface of the backing member and located above the upper surface of the upper electrode, wherein the guard ring is configured to provide an inner gap between the outer surface of the backing member and an inner periphery of the guard ring. The lower electrode assembly is adapted to receive a semiconductor substrate. The plasma confinement assembly is separated from an outer periphery of the upper electrode and the backing member by the guard ring.

20 Claims, 6 Drawing Sheets

PLASMA PROCESSING CHAMBER WITH GUARD RING FOR UPPER ELECTRODE ASSEMBLY

CROSS-REFERENCE TO RELATED APPLICATION

This application is a continuation of U.S. patent application Ser. No. 11/701,430, filed Feb. 2, 2007, now U.S. Pat. No. 7,482,550 which claims priority to U.S. Patent Provisional Application No. 60/852,345 filed Oct. 16, 2006, and which are incorporated herein by this reference in their entirety.

SUMMARY

In accordance with an embodiment, a plasma processing chamber comprises: an upper electrode assembly having an upper electrode, a backing member, the backing member attachable to an upper surface of the upper electrode, and a guard ring surrounding an outer surface of the backing member and located above the upper surface of the upper electrode, wherein the guard ring is configured to provide an inner gap between the outer surface of the backing member and an inner periphery of the guard ring; a lower electrode assembly adapted to receive a semiconductor substrate; and a plasma confinement assembly, which surrounds an outer periphery of the upper electrode and the backing member.

In accordance with another embodiment, a plasma processing chamber comprises: a showerhead electrode bonded to a backing member; a confinement ring assembly, which surrounds the showerhead electrode; a guard ring configured to fit between an outer periphery of the backing member and an inner surface of the confinement ring assembly, the guard ring having a lower surface adapted to overlie an upper surface of the showerhead electrode, and wherein the guard ring is dimensioned to provide an inner gap between the outer periphery of the backing member and an inner periphery of the guard ring, and an outer gap between the outer periphery of the guard ring and the inner surface of the confinement ring assembly; and a lower electrode assembly adapted to receive a semiconductor substrate.

DETAILED DESCRIPTION

The fabrication of an integrated circuit chip typically begins with a thin, polished slice of high-purity, single-crystal semiconductor material substrate (such as silicon or germanium) called a "wafer." Each wafer is subjected to a sequence of physical and chemical processing steps that form the various circuit structures on the wafer. During the fabrication process, various types of thin films may be deposited on the wafer using various techniques such as thermal oxidation to produce silicon dioxide films, chemical vapor deposition to produce silicon, silicon dioxide, and silicon nitride films, and sputtering or other techniques to produce other metal films.

After depositing a film on the semiconductor wafer, the unique electrical properties of semiconductors are produced by substituting selected impurities into the semiconductor crystal lattice using a process called doping. The doped silicon wafer may then be uniformly coated with a thin layer of photosensitive, or radiation sensitive material, called a "resist." Small geometric patterns defining the electron paths in the circuit may then be transferred onto the resist using a process known as lithography. During the lithographic process, the integrated circuit pattern may be drawn on a glass plate called a "mask" and then optically reduced, projected, and transferred onto the photosensitive coating.

The lithographed resist pattern is then transferred onto the underlying crystalline surface of the semiconductor material through a process known as etching. Vacuum processing chambers are generally used for etching and chemical vapor deposition (CVD) of materials on substrates by supplying an etching or deposition gas to the vacuum chamber and application of a radio frequency (RF) field to the gas to energize the gas into a plasma state.

A reactive ion etching system typically consists of an etching chamber with an upper electrode or anode and a lower electrode or cathode positioned therein. The cathode is negatively biased with respect to the anode and the container walls. The wafer to be etched is covered by a suitable mask and placed directly on the cathode. A chemically reactive gas such as $CF_4$, $CHF_3$, $CClF_3$, $HBr$, $Cl_2$ and $SF_6$ or mixtures thereof with $O_2$, $N_2$, He or Ar is introduced into the etching chamber and maintained at a pressure which is typically in the millitorr range. The upper electrode is provided with gas hole(s), which permit the gas to be uniformly dispersed through the electrode into the chamber. The electric field established between the anode and the cathode will dissociate the reactive gas forming plasma. The surface of the wafer is etched by chemical interaction with the active ions and by momentum transfer of the ions striking the surface of the wafer. The electric field created by the electrodes will attract the ions to the cathode, causing the ions to strike the surface in a predominantly vertical direction so that the process produces well-defined vertically etched sidewalls. The etching reactor electrodes may often be fabricated by bonding two or more dissimilar members with mechanically compliant and/or thermally conductive adhesives, allowing for a multiplicity of function.

Figure 1:
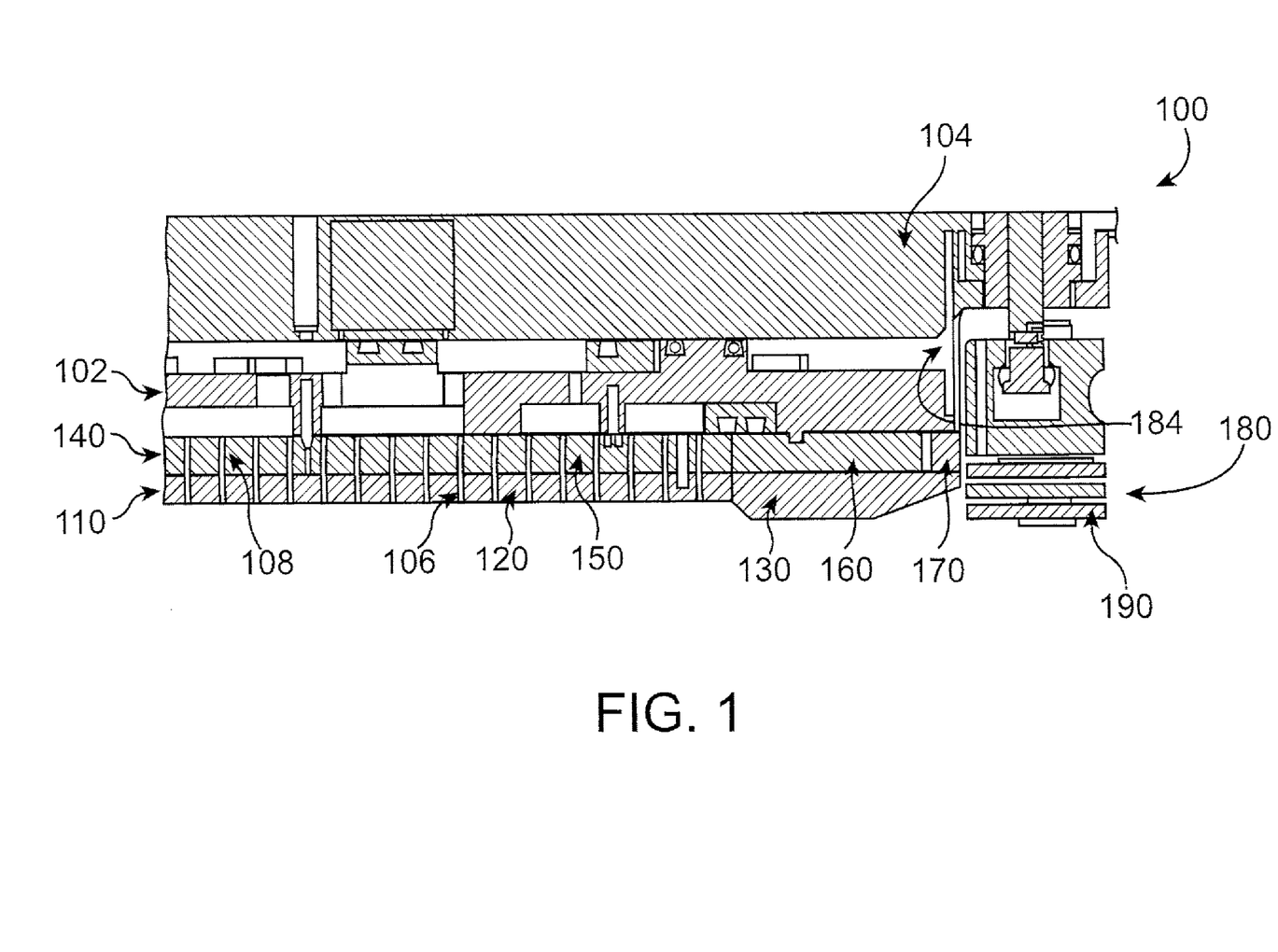
FIG. 1 shows a cross-sectional view of a showerhead electrode assembly of a plasma reactor for etching substrates having a guard ring.

FIG. 1 shows a cross-sectional view of a portion of a showerhead electrode assembly 100 of a plasma processing system for etching substrates. As shown in FIG. 1, the showerhead electrode assembly 100 includes an upper electrode 110, a backing member 140, and a guard ring (or outer ring) 170. The showerhead electrode assembly 100 also includes a plasma confinement assembly (or wafer area pressure (WAP) assembly) 180, which surrounds the outer periphery of the upper electrode 110 and the backing member 140. The guard ring 170 surrounds the backing member 140 and preferably is positioned or centered around the backing member 140, such that during thermal cycling of the plasma processing system, the guard ring 170 minimizes the variation in a radial gap 200 between the guard ring 170 and the confinement assembly 180. It can be appreciated that although the outer ring or guard ring 170 is shown in conjunction with a reactive ion etching system, the guard ring and centering features can be used with any suitable system including a clean-etch system or a dry etch system.

The assembly 100 also includes a thermal control member 102, and an upper plate 104. The upper electrode 110 preferably includes an inner electrode 120, and an optional outer electrode 130. The inner electrode 120 is preferably a cylindrical plate and may be made of single crystal silicon. The backing member 140 is secured to the inner electrode 120 and the outer electrode 130 with an elastomeric material. The backing member 140 can include an inner backing member 150, an optional outer backing member 160. If the backing member 140 is comprised of a single cylindrical plate, the guard ring 170 surrounds the backing member 140. Alternatively, if the backing member 140 is a comprised of an inner and an outer backing member 150, 160, the guard ring 170 is adapted to surround the outer backing member 160.

The showerhead electrode assembly 100 as shown in FIG. 1 is typically used with an electrostatic chuck (not shown) having a flat lower electrode on which a wafer is supported spaced 1 to 2 cm below the upper electrode 110. An example of such a plasma processing system is a parallel plate type reactor, such as the Exelan® dielectric etch systems, made by Lam Research Corporation of Fremont, Calif. Such chucking arrangements provide temperature control of the wafer by supplying backside helium (He) pressure, which controls the rate of heat transfer between the wafer and the chuck.

The upper electrode 110 is a consumable part which mist be replaced periodically. In a preferred embodiment, the upper electrode 110 is a showerhead electrode provided with a plurality of spaced apart gas discharge passages 106, which are of a size and distribution suitable for supplying a process gas, which is energized by the electrode and forms plasma in a reaction zone beneath the upper electrode 110.

The showerhead electrode assembly 100 also includes a plasma confinement assembly (or wafer area plasma (WAP) assembly) 180, which surrounds the outer periphery of the upper electrode 110 and the backing member 140. The plasma confinement assembly 180 is preferably comprised of a stack or plurality of spaced-apart quartz rings 190, which surrounds the outer periphery of upper electrode 110 and the backing member 140. During processing, the plasma confinement assembly 180 causes a pressure differential in the reaction zone and increases the electrical resistance between the reaction chamber walls and the plasma thereby confining the plasma between the upper electrode 110 and the lower electrode (not shown).

During use, the confinement rings 190 confine the plasma to the chamber volume and controls the pressure of the plasma within the reaction chamber. The confinement of the plasma to the reaction chamber is a function of many factors including the spacing between the confinement rings 190, the pressure in the reaction chamber outside of the confinement rings and in the plasma, the type and flow rate of the gas, as well as the level and frequency of RF power. For effective plasma confinement, the pressure outside the confinement rings 190 should be as low as possible, preferably less than 30 millitorr. Confinement of the plasma is more easily accomplished if the spacing between the confinement rings 190 is very small. Typically, a spacing of 0.15 inches or less is required for confinement. However, the spacing of the confinement rings 190 also determines the pressure of the plasma, and it is desirable that the spacing can be adjusted to achieve the pressure required for optimal process performance while maintaining plasma. Process gas from a gas supply is supplied to electrode 110 through one or more passages in the upper plate 104. The gas then is distributed through one or more vertically spaced apart baffle plates and passes through gas distribution holes 106 in the electrode 110 to evenly disperse the process gas into reaction zone.

The inner electrode 120 is preferably a planar disk or plate having a uniform thickness from center (not shown) to an outer edge. The inner electrode 120 can have a diameter smaller than, equal to, or larger than a wafer to be processed, e.g., up to 300 mm, if the plate is made of single crystal silicon, which is the maximum diameter of currently available single crystal silicon material. For processing 300 mm wafers, the outer electrode 130 is adapted to expand the diameter of the upper electrode 110 from about 15 inches to about 17 inches. The outer electrode 130 can be a continuous member (e.g., a poly-silicon member, such as a ring), or a segmented member (e.g., 2-6 separate segments arranged in a ring configuration, such as segments of single crystal silicon). The inner electrode 120 preferably includes multiple gas passages 106 for injecting a process gas into a space in a plasma reaction chamber below the upper electrode 110.

Single crystal silicon is a preferred material for plasma exposed surfaces of the inner electrode 120 and the outer electrode 130. High-purity, single crystal silicon minimizes contamination of substrates during plasma processing as it introduces only a minimal amount of undesirable elements into the reaction chamber, and also wears smoothly during plasma processing, thereby minimizing particles. Alternative materials that can be used for plasma-exposed surfaces of the upper electrode 110 include SiC, SiN, and AlN, for example.

In configurations, the showerhead electrode assembly 100 is large enough for processing large substrates, such as semiconductor wafers having a diameter of 300 mm. For 300 mm wafers, the upper electrode 110 is at least 300 mm in diameter. However, the showerhead electrode assembly 100 can be sized to process other wafer sizes or substrates having a non-circular configuration.

Figure 2:
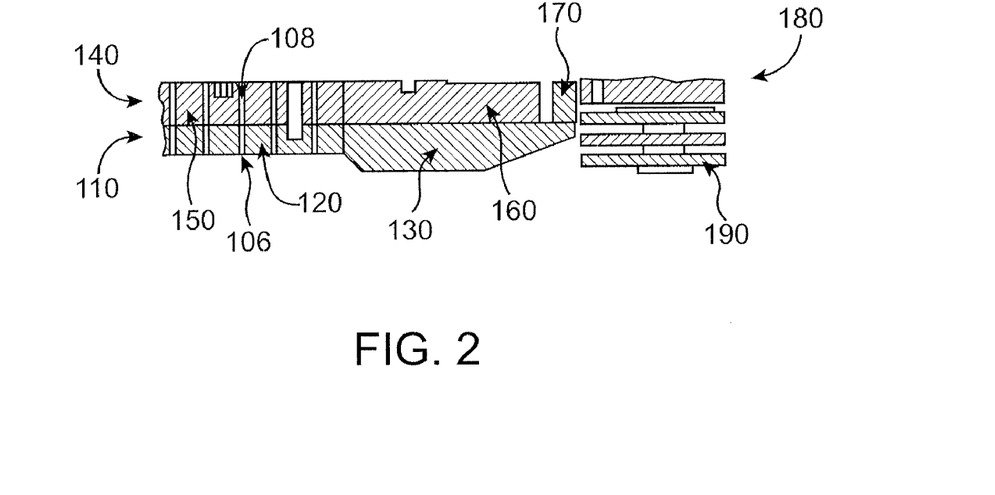
FIG. 2 shows a cross-sectional view of a portion of the showerhead electrode assembly of FIG. 1.

FIG. 2 shows a cross-sectional view of a portion of the showerhead electrode assembly of FIG. 1. As shown in FIG. 2, the showerhead electrode assembly 100 includes the inner electrode 120, the outer electrode 130, the inner backing member 150, the outer backing member 160, the outer or guard ring 170, and the plasma confinement rings 190. In such configurations, the inner electrode 120 is preferably co-extensive with the inner backing member 150, and the outer electrode 130 is co-extensive with the surrounding backing member 160. However, the inner backing member 150 can extend beyond the inner electrode 120 such that the backing member 140 (FIG. 3) can be a single disk or plate that is used to support the inner electrode 120 and the outer electrode 130. The inner electrode 120 and the outer electrode 130 are preferably attached to the inner and outer backing members 150, 160 with an elastomeric bonding material. The inner backing member 150 includes gas passages 108 aligned with the gas passages 106 in the inner electrode 120 to provide gas flow into the plasma-processing chamber. The gas passages 108 of the inner backing member 150 typically have a diameter of about 0.04 inches, with the gas passages 106 of the inner electrode 120 typically having a diameter of about 0.025 inches.

The inner backing member 150 and outer backing member 160 are preferably made of a material that is chemically compatible with process gases used for processing semiconductor substrates in the plasma processing chamber, have a coefficient of thermal expansion closely matching that of the electrode material, and/or are electrically and thermally conductive. Preferred materials that can be used to make the backing member 140, including the inner and outer backing members 150, 160 can include, but are not limited to, graphite, SiC, aluminum (Al), or other suitable materials.

The inner and the outer electrodes 120, 130 can be attached to the inner backing member 150 and the outer backing member 160, respectively with a thermally and electrically conductive elastomeric bonding material (not shown). The elastomeric bonding material allows for relative movement between the upper electrode 110 and the backing member 140 during thermal stresses due to thermal cycling. The bonding material also transfers heat and electrical energy between the inner and the outer electrodes 120, 130 and the inner and the outer backing members 150, 160. The use of elastomeric bonding material for bonding together surfaces of an electrode assembly 100 is described, for example, in commonly owned U.S. Pat. No. 6,073,577, which is incorporated herein by reference in its entirety.

The inner backing member 150 and the outer backing member 160 are preferably attached to the thermal control member 102 with suitable fasteners, which can be threaded bolts, screws, or the like. For example, bolts (not shown) can be inserted in holes in the thermal control member 102 and screwed into threaded openings in the backing member 140. The thermal control member 102 includes a flexure portion 184 and is preferably made of a machined metallic material, such as aluminum, an aluminum alloy or the like. The upper plate 104 is preferably made of aluminum or an aluminum alloy. The plasma confinement assembly (or wafer area plasma assembly (WAP)) 180 is positioned outwardly of the showerhead electrode assembly 100. The suitable plasma confinement assembly 180 including a plurality of vertically adjustable plasma confinement rings 190 is described in commonly owned U.S. Pat. No. 5,534,751, which is incorporated herein by reference in its entirety.

Figure 3:
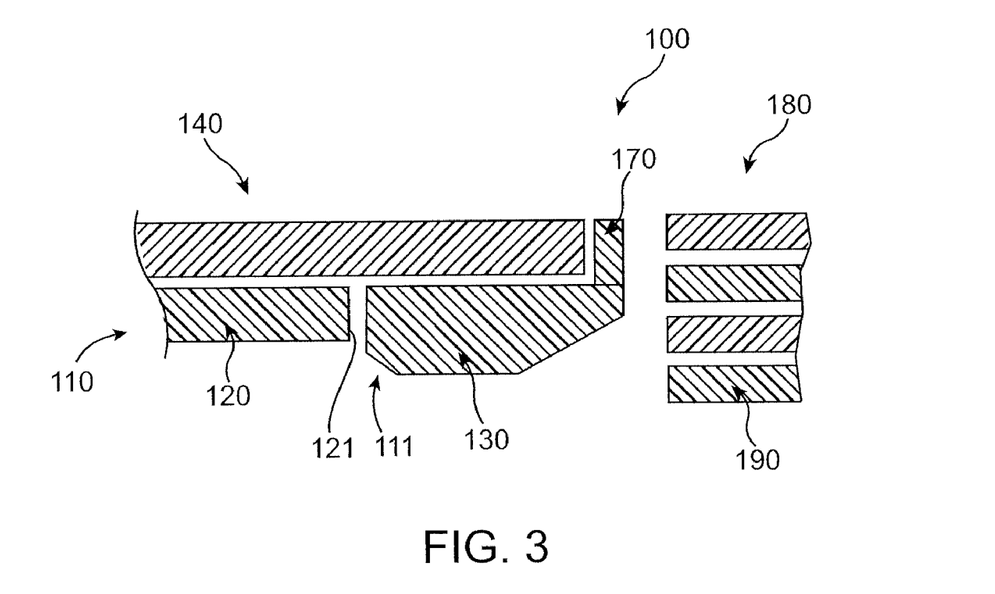
FIG. 3 shows a cross-sectional view of a portion of the showerhead electrode assembly of FIG. 2 comprising an upper electrode, a backing member and the guard ring.

FIG. 3 shows a cross-sectional view of a portion of the showerhead electrode assembly of FIG. 2 comprising an upper electrode 110 having an inner electrode 120, and an outer electrode 130, a backing member 140 comprised of a single disk or plate, and a guard ring 170. As shown in FIG. 3, the backing member 140 can also extend beyond an outer edge 121 of the inner electrode 120, such that a single backing member 140 can be used instead of an inner backing member 150 and an outer backing member 160 as shown in FIG. 2. The outer edge 121 of the inner electrode 120 is typically vertical as shown in FIG. 3. However, it can be appreciated that the outer edge 121 of the inner electrode 120 can have an orientation, which is not vertical.

As shown in FIG. 3, the inner edge and the outer edge of the outer electrode 130 can include an inner surface and an outer surface, which are angled towards the lower surface of the outer electrode. The inner and outer surfaces with the lower surface of the outer electrode 130 can extend into the reaction zone at a greater depth than the lower surface of the inner electrode 120. The inner surface of the outer electrode 130 can be described as a step 111, as described in commonly owned U.S. Pat. No. 6,824,627, which is incorporated herein by reference in its entirety. The step 111 is provided to control the density of plasma formed adjacent to the exposed lower surfaces during plasma processing. The step 111 is preferably substantially aligned above an edge ring of the lower electrode (not shown) and is positioned just outside the edge of the wafer. The angles of the inner surface and the outer surface are preferably between about 15 and 85 degrees.

In accordance with one embodiment, the outer electrode 130 is preferably comprised of a plurality of segments, wherein the segments are attached to one another with an elastomeric bonding material. The plurality of segments allow for the expansion of the outer electrode 130 during processing of a semiconductor substrate in the processing zone. During processing, heat is transferred from the inner electrode 120 and the outer electrode 130 to the inner backing member 150, the outer backing member 160, and the thermal control plate 102, and then to the upper plate 104 via thermal conduction.

Figure 4:
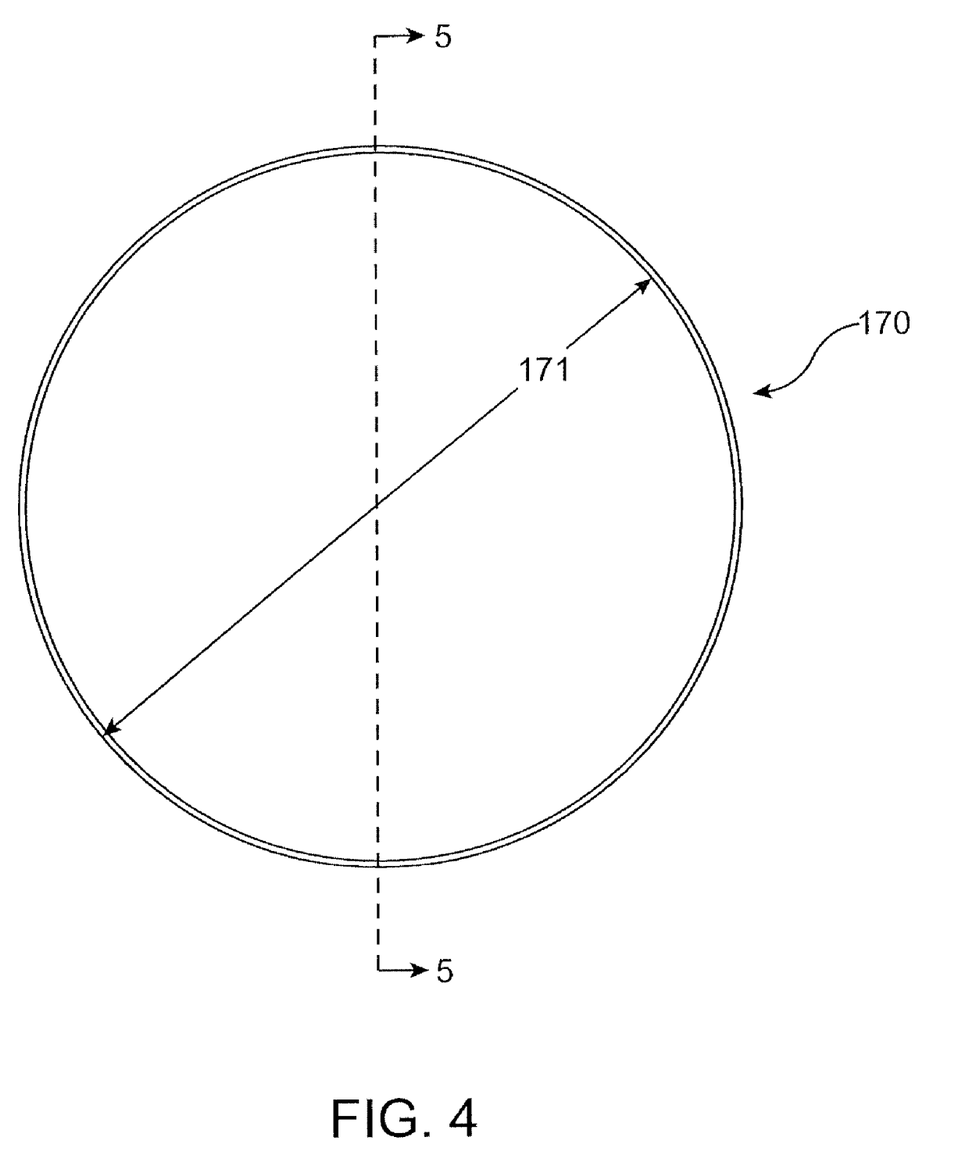
FIG. 4 shows a top view of the guard ring.

FIG. 4 shows a top view of a guard ring 170 in accordance with one embodiment. As shown in FIG. 4, the guard ring 170 is preferably circular having an inner diameter 171 and an outer diameter 173 (FIG. 5).

Figure 5:
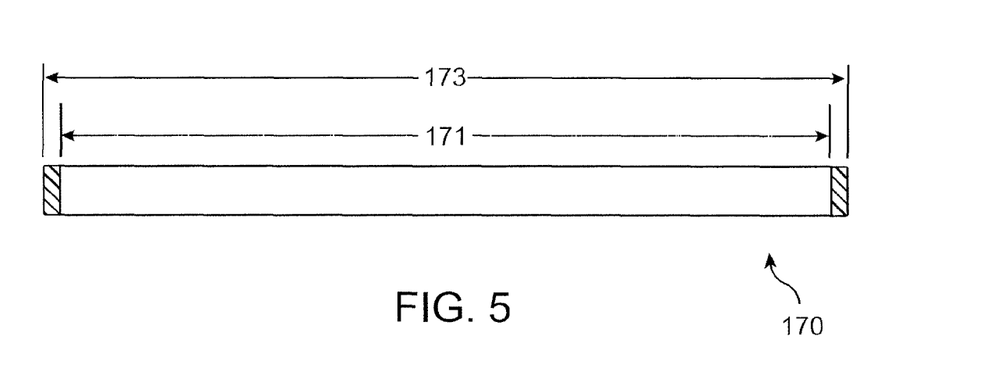
FIG. 5 shows a cross-sectional view of the guard ring of FIG. 4 along the line 5-5.

FIG. 5 shows a cross-sectional view of the guard ring 170 of FIG. 4 along the line 5-5. As shown in FIG. 5, the guard ring 170 is circular having an inner diameter 171 and an outer diameter 173. In accordance with one embodiment, the inner diameter 171 of the guard ring 170 is preferably 16.695 to 16.725 inches, and more preferably about 16.705 to 16.715 inches, and most preferably about 16.710 inches for an upper backing member having an outer diameter of about 16.620 to 16.660 inches. The outer diameter 173 of the guard ring is preferably about 16.980 to 17.020 inches, and more preferably about 16.990 to 17.010 inches, and most preferably about 17.000 inches for an upper backing member having an outer diameter of about 16.620 to 16.660 inches. It can be appreciated that the inner and outer diameters 171, 173 of the guard ring 170 will vary depending on the outer diameter of the backing member 140 including the outer diameter of the outer backing member 160.

Figure 6:
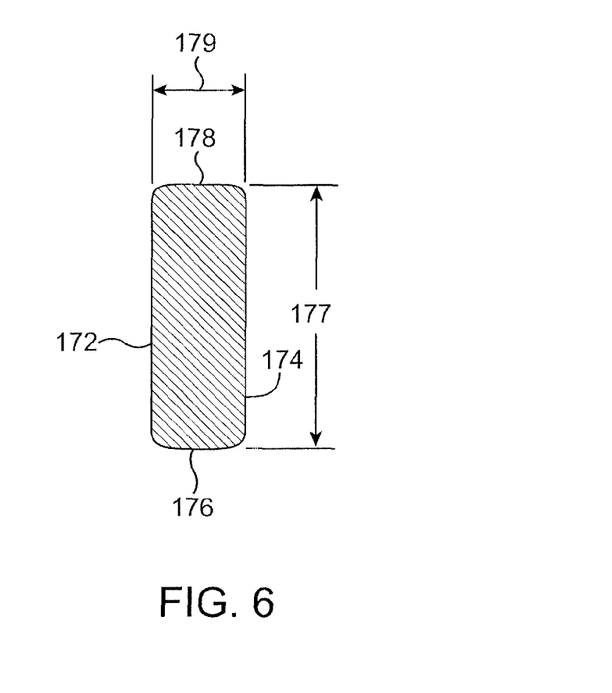
FIG. 6 shows a cross-sectional view of the guard ring in accordance with one embodiment.

FIG. 6 shows a cross-sectional view of the guard ring 170 in accordance with another embodiment. As shown in FIG. 6, the guard ring 170 preferably has a rectangular cross-section comprised of the inner edge 172, the outer edge 174, the lower surface 176 and the upper surface 178. The inner edge 172 and the outer edge 174 preferably have a height 177 of about 0.380 to 0.394 inches, and more preferably about 0.384 to 0.390 inches and most preferably about 0.387 inches, and a width 179 of about 0.140 to 0.150 inches, and more preferably about 0.142 and 0.147 inches, and most preferably about 0.145 inches. In accordance with one embodiment, the corners between the inner edge 172, the outer edge 174, the lower surface 176, and the upper surface 178 are preferably rounded having a radius of between about 0.025 and 0.010 inches. It can be appreciated that the height and width 177, 179 of the guard ring 170 can vary depending on the height and width of the backing member 140 including the height and of the outer backing member 160.

Figure 7:
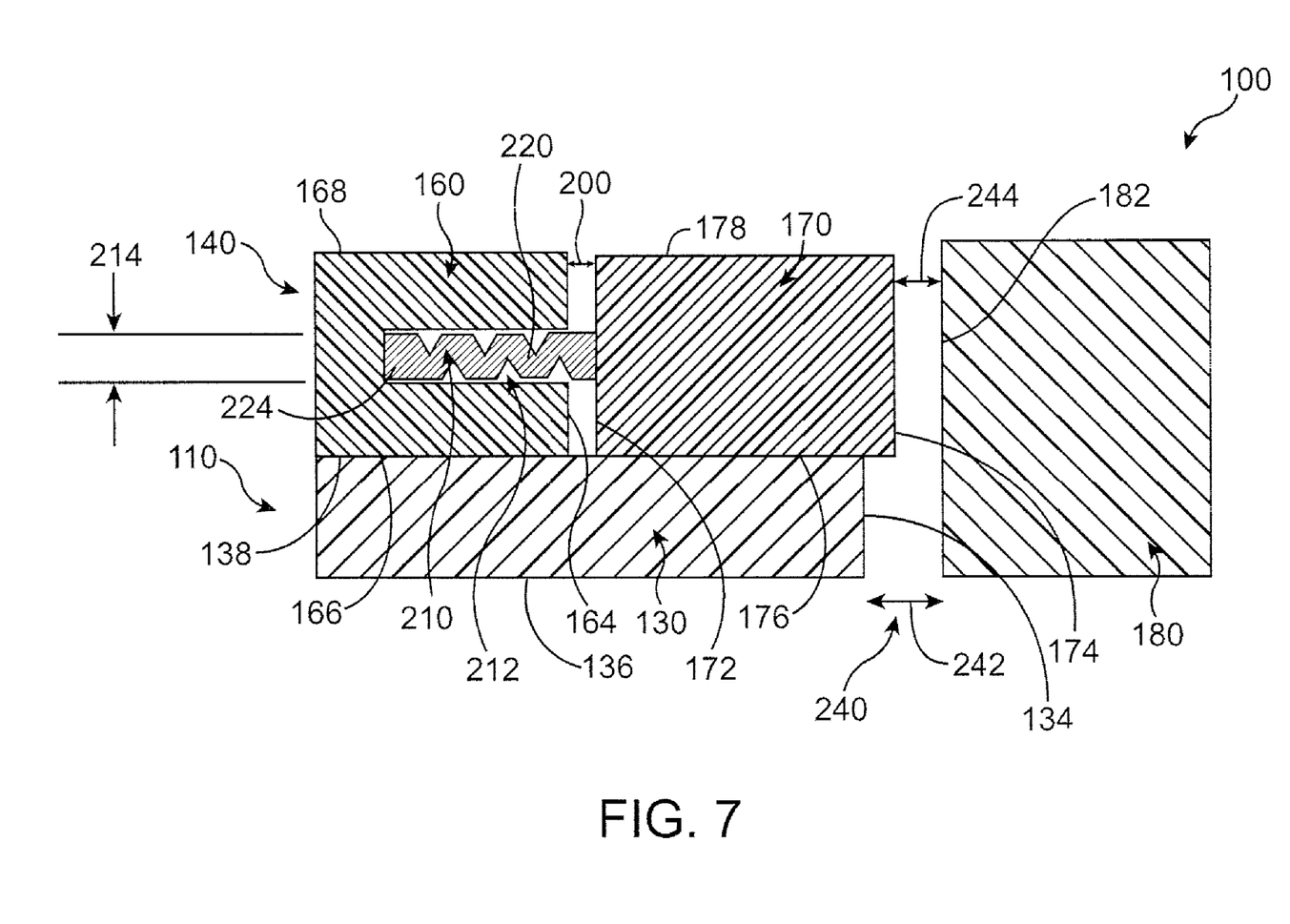
FIG. 7 shows a cross-sectional view of a portion of the upper electrode and backing member having a guard ring in accordance with one embodiment.

FIG. 7 shows a cross-sectional view of a portion of the outer electrode 110 and backing member 140 having a guard ring 170 surrounding the outer backing member 160 in accordance with one embodiment. As shown in FIG. 7, the guard ring 170 surrounds the outer backing member 160 and preferably is configured to U.S. Pat. No. 6,824,627. The guard ring 170 has an inner edge 172, an outer edge 174, a lower surface 176, and an upper surface 178. An inner gap 200 exists between the outer edge 164 of the outer backing member 160 and the inner edge 172 of the guard ring 170. The guard ring 170 is preferably centered around the outer edge 164 of the outer backing member 160 through a centering element 210.

It can be appreciated that, the guard ring 170 can be centered around the outer edge 164 of the outer backing member 140 using a suitable centering element 210 with a spring, a spring-like device or other elastomeric element 220. As shown in FIG. 7, the outer backing member 160 preferably includes a plurality of holes or cavities 212, which are each adapted to receive the centering element 210 creating an inner gap 200 between the outer edge 164 of the outer backing member 160 and the inner edge 172 of the guard ring 170. The holes or cavities 212 have a diameter 214, which is slightly larger than the outer diameter of the centering element 210. The centering element 210 is adapted to control the distance between the outer edge 164 of the outer backing member 160 and the inner edge 172 of the guard ring 170 during thermal expansion and/or contraction of the upper electrode 110, the backing member 140 and the guard ring 170. In addition, an upper radial gap (or outer gap) 244 exists between the outer edge 174 of the guard ring 170 and an inner edge 182 of the plasma confinement assembly 180.

As shown in FIG. 7, the guard ring 170 can be positioned directly on an upper surface 138 of the outer electrode 130 and concentrically centered around the backing member 140 via the centering elements 210. The radial gap 244 between the outer edge 174 of the guard ring 170 and the inner edge 182 of the confinement assembly 180 is preferably maintained at a consistent distance, such that the system 100 is operable over a broad temperature range, which provides consistent gas performance during use and provides the system 100 with improved performance.

In accordance with one embodiment, an outer radial gap 240 can include a lower radial gap 242 and an upper radial gap 244. The lower radial gap 242 is between the outer edge 134 of the outer electrode 130 and the inner edge 182 of the confinement assembly 180. The upper radial gap 244 is between the outer edge 174 of the guard ring 170 and the inner edge 182 of the confinement assembly 180. The upper radial gap 244 for a 300 mm upper electrode assembly will preferably be about 0.0325 to 0.0375 inches, and more preferably about 0.035 inches before expansion and contraction of the electrode assembly 100 during use. The lower radial gap 242 will preferably be about 0.058 to 0.060 inches, and more preferably about 0.059 inches.

It can be appreciated that as a result of the different material used for the upper electrode 110 and the backing member 140 and the guard ring 170, the upper radial gap 244 and the lower radial gap 242 can vary during operation of the system. However, it can be appreciated that by adding the guard ring 170, the difference can be controlled such that the system will provide improved performance over a broad range of operating temperatures.

It can be appreciated that the guard ring 170 is preferably made from the same material (e.g., quartz) as the neighboring wafer area plasma (WAP) confinement assembly 180. As shown in FIG. 7, the confinement assembly 180 will have a larger diameter than the outer diameter 173 of the guard ring 170. During use or operation of the plasma chamber, the guard ring 170 expands and/or contracts at a similar rate as the confinement assembly 180 including the plurality of confinement rings 190 (not shown). Thus, a consistent radial gap 240 is maintained between the guard ring 170 and the confinement assembly 180 including the plurality of confinement rings 190 over a broad temperature range, which provides consistent gas flow performance.

It can be appreciated that in accordance with one embodiment, the guard ring 170 is made of a material, which has a low coefficient of thermal expansion (CTE), which is dimensionally stable over a broad temperature range. Alternatively, the guard ring 170 and the confinement assembly 180 (including the plurality of confinement rings 190) can be made of different materials, which have a similar coefficient of thermal expansion and wherein the material has electrically insulative or dielectric material properties. In use, the guard ring 170 minimizes the variation in the radial gap 244 between the guard ring 170 and the confinement assembly 180 (including the plurality of confinement rings 190) during changing operating conditions within the chamber.

In accordance with another embodiment, the radial gap 244 is large enough to assure that the guard ring 170 and the confinement assembly 180 (including the plurality of confinement rings 190) do not radially contact one another under the combined effect of worst case manufacturing tolerance and worst case misalignment. In addition, the radial gap 244 preferably maintains a minimal gap, which keeps the gas conductance as low as possible in this area of the process gas flow path for optimal chamber performance.

In addition, the radial gap 200 between the guard ring 170 and the upper electrode backing member 140 can be minimized, such that the tolerances can be better controlled. As set forth above, the inner gap 200 is preferably configured such that the guard ring 170 and the upper backing member 140 do not radially contact one another during use. It can be can be appreciated that by maintaining the inner gap 200 between the outer edge 164 of the outer backing member 160 and the inner edge 172 of the guard ring 170 that contact can be avoided under the combined situations including a worst case manufacturing tolerance and a worst case misalignment. In addition, it can be appreciated that contact between the backing member 140 and the guard ring can be avoided during thermal expansion of the upper electrode backing member 140 over the systems operating range. In addition, the guard ring 170 minimizes the exposure of the upper electrode backing members 140 outer circular surface to free radical and ion bombardment of the plasma. In accordance with one embodiment, for a backing member 140 comprised of aluminum, the formation of aluminum fluoride on the surface of the backing member 140 can be eliminated and/or minimized.

The guard ring 170 is adapted to minimize or eliminate any axial gaps between the guard ring 170 and the supporting upper electrode's silicon surface, such that the guard ring 170 can protect the exposed bond lines between the silicon upper electrode 110 and the backing plate or member 140 from eroding effects of free radical and ion bombardment of the plasma. In addition, it can be appreciated that the guard ring 170 can also minimize or eliminate process gases from flowing through the exposed bond line to optimize chamber performance.

In accordance with another embodiment, the guard ring 170 can also minimize the axial gap between the guard ring 170 and the thermal control member 102. It can be appreciated that the guard ring 170 can also minimize exposure of the surface of the thermal control member 102 to free radical and ion bombardment of the plasma.

In accordance with a further embodiment, the addition of a guard ring 170 to the plasma etch chamber and the backing member 140, and by controlling all the above factors can eliminate electrical arcing or plasma light-up between the upper electrode, backing member 140 and the confinement rings 190.

Figure 8:
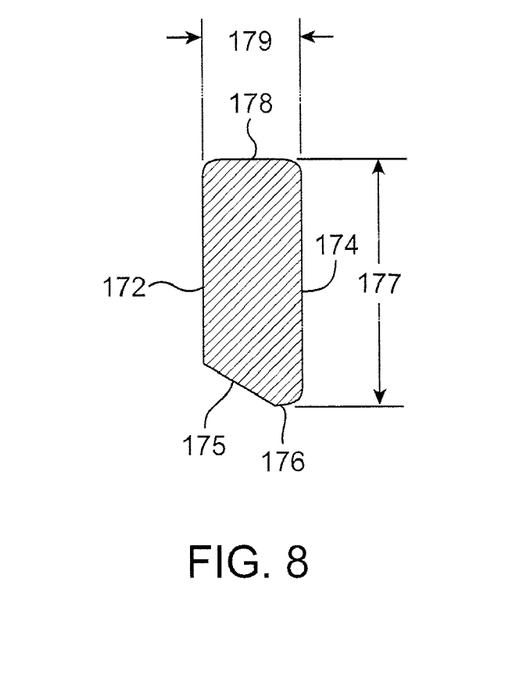
FIG. 8 shows a cross-sectional view of the guard ring in accordance with another embodiment.

FIG. 8 shows a cross-sectional view of the guard ring in accordance with another embodiment. As shown in FIG. 8, the guard ring 170 has an angled lower edge 175 (or chamfered surface) extending from the inner edge 172 to the lower surface 176. The inner edge 172 and the outer edge 174 preferably have a height 177 of about 0.332 to 0.372 inches, and more preferably about 0.342 to 0.362 inches and most preferably about 0.352 inches, and a width 179 of about 0.140 to 0.150 inches, and more preferably about 0.142 and 0.147 inches, and most preferably about 0.145 inches. The angled lower edge 175 can extend from the inner edge 172 to the outer edge 174 for a distance of about 0.090 to 0.110 inches and more preferably about 0.100 inches and forms an angle with the inner edge of approximately 50 to 70 degrees and more preferably about 60 degrees. In accordance with one embodiment, the corners between the inner edge 172, the outer edge 174, the lower surface 176, the upper surface 178, and the angled lower edge 175 are preferably rounded having a radius of between about 0.025 and 0.010 inches. It can be appreciated that at the corner where the inner edge 172 and the lower edge 175 meet, the corner includes an edge break of about 0.005 inches maximum.

Figure 9:
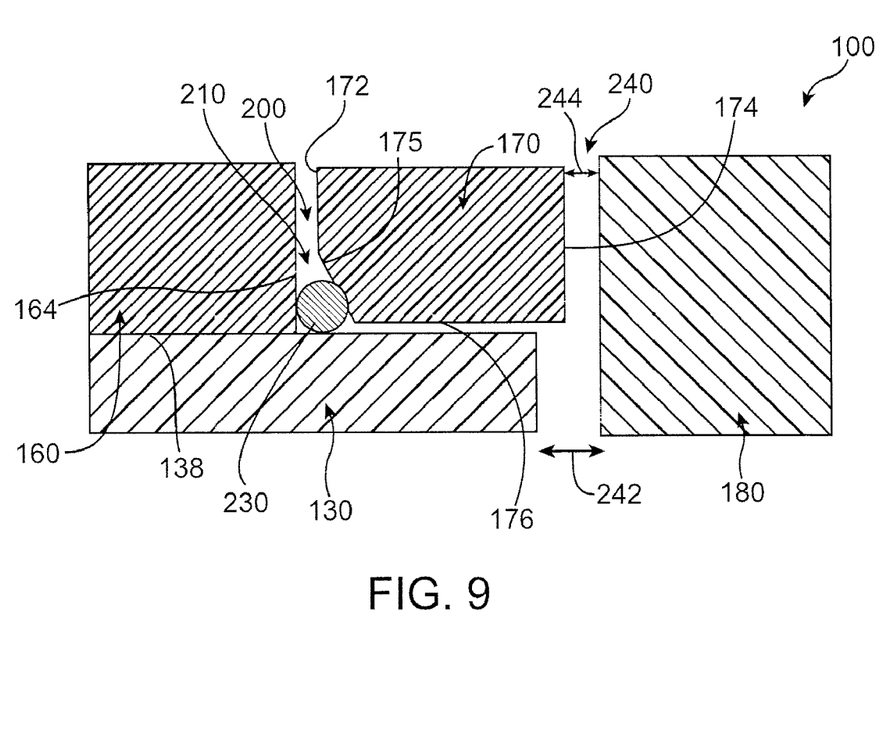
FIG. 9 shows a cross-sectional view of a portion of the upper electrode and backing member a guard ring in accordance with a further embodiment.

FIG. 9 shows a cross-sectional view of a portion of the upper electrode 110 and backing member 140 having a guard ring 170 surrounding an outer upper backing member 160 in accordance with another embodiment. As shown in FIG. 9, the system includes a guard ring 170 with an angled lower edge 175 (or chamfered surface) extending from the inner edge 172 to the lower surface 176 of the guard ring 170. A centering element 210 in the form of a circular ring 230 is positioned between the outer edge 164 of the backing member 140 and the angled lower edge 175 of the guard ring 170 and is positioned on an upper surface 138 of the outer electrode 130. The circular ring 230 is preferably a hollow ring made of Teflon® (polytetrafluoroethylene (PTFE)), a fluoropolymer material, a polyimide, such as Vespel®, or other suitable polymeric or polymeric-like material. It can be appreciated that if a PTFE material cannot be utilized due to other factors, a material with the lowest coefficient of friction is preferred. The circular ring 230 is utilized to maintain a uniform gap 200 between the outer backing member and the guard ring 170 about the full circumference of the guard ring 170 during thermal expansion and contraction of the backing member and the guard ring 170 during use.

In accordance with the embodiment as shown in FIG. 9, the guard ring 170 preferably does not rest or lie upon the upper surface 138 of the upper or outer electrode 110, 130. The angle between surfaces 172, 175, and the gap between surfaces 176 and 138 are optimized to assure surface 176 does not touch or come into contact under all thermal and tolerance conditions. It can be appreciated that the circular ring 230 can also block any line of sight or gas flow path to the upper electrode bond and the outer conical surface, which shields the upper electrode bond from free radical and ion bombardment erosion of the plasma. In addition, this protects the backing plate outer surface from free radical and ion bombardment exposure from the plasma, and associated aluminum fluoride formation.

The present invention has been described with reference to preferred embodiments. However, it will be readily apparent to those skilled in the art that it is possible to embody the invention in specific forms other than as described above without departing from the spirit of the invention. The preferred embodiment is illustrative and should not be considered restrictive in any way. The scope of the invention is given by the appended claims, rather than the preceding description, and all variations and equivalents, which fall within the range of the claims, are intended to be embraced therein.

What is claimed is:

1. A plasma processing chamber comprising:
    an upper electrode assembly having an upper electrode, a backing member, the backing member attachable to an upper surface of the upper electrode, and a guard ring surrounding an outer surface of the backing member and located above the upper surface of the upper electrode, wherein the guard ring is configured to provide an inner gap between the outer surface of the backing member and an inner periphery of the guard ring;
    a lower electrode assembly adapted to receive a semiconductor substrate; and
    a plasma confinement assembly, which surrounds the guard ring.

2. The chamber of claim 1, further comprising a reaction zone between the upper electrode assembly and the lower electrode assembly.

3. The chamber of claim 2, further comprising a gas supply, wherein the gas supply supplies a process gas to gas distribution holes in the upper electrode to disperse the process gas into the reaction zone.

4. The chamber of claim 1, wherein the plasma confinement assembly is comprised of a stack of spaced-apart quartz rings.

5. The chamber of claim 1, wherein; (a) the guard ring consists of quartz; (b) the backing member consists of aluminum or an aluminum alloy; (c) the upper electrode consists of single crystal silicon and/or (d) the upper electrode comprises an inner electrode and an outer electrode.

6. The chamber of claim 5, wherein the outer electrode is a segmented member comprising a plurality of segments forming an outer electrode ring.

7. The chamber of claim 1, wherein: (a) the backing member comprises an inner backing member and an outer backing member; (b) a bonding material attaches the upper surface of the upper electrode to the backing member; and/or (c) the upper electrode consists of single crystal silicon.

8. The chamber of claim 1, wherein the guard ring has a rectangular cross section.

9. The chamber of claim 1, wherein the inner periphery of the guard ring includes an upper vertical surface and a lower inclined surface.

10. The chamber of claim 1, wherein a lower surface of the guard ring extends outwardly of the upper surface of the upper electrode.

11. The chamber of claim 10, wherein: (a) the guard ring has a generally rectangular cross-section; (b) the backing member consists of aluminum or an aluminum alloy; (c) the upper electrode consists of single crystal silicon and/or (d) the guard ring consist of quartz.

12. The chamber of claim 1, wherein the upper electrode assembly is a showerhead electrode assembly.

13. The chamber of claim 1, wherein the backing member has an outer periphery spaced inwardly of an outer periphery of the upper electrode and the guard ring is separated from the outer periphery of the backing member by an annular gap.

14. The chamber of claim 1, wherein the guard ring is separated from an upper surface of the upper electrode by an annular gap.

15. A plasma processing chamber comprising:
    a showerhead electrode bonded to a backing member;
    a confinement ring assembly, which surrounds the showerhead electrode;
    a guard ring configured to fit between an outer periphery of the backing member and an inner surface of the confinement ring assembly, the guard ring having a lower surface facing an upper surface of the showerhead electrode, and wherein the guard ring is dimensioned to provide an inner gap between the outer periphery of the backing member and an inner periphery of the guard ring, and an outer gap between the outer periphery of the guard ring and the inner surface of the confinement ring assembly;
    a lower electrode assembly adapted to receive a semiconductor substrate; and
    a reaction zone between the showerhead electrode and the lower electrode assembly in which process gas passing through the showerhead electrode is energized into a plasma state.

16. The chamber of claim 15, wherein the confinement ring assembly is comprised of a plurality of spaced-apart quartz rings.

17. The chamber of claim 15, wherein; (a) the guard ring consists of quartz; (b) the backing member consists of aluminum or an aluminum alloy; (c) the showerhead electrode consists of single crystal silicon and/or (d) the showerhead electrode comprises an inner electrode and an outer electrode.

18. The chamber of claim 15, wherein a lower surface of the guard ring extends outwardly of the upper surface of the showerhead electrode.

19. The chamber of claim 15, wherein the backing member has an outer periphery spaced inwardly of an outer periphery of the showerhead electrode and the guard ring is separated from the outer periphery of the backing member by an annular gap.

20. The chamber of claim 15, wherein the guard ring is separated from an upper surface of the showerhead electrode by an annular gap.

* * * * *